US009419658B2

(12) United States Patent
Seebacher et al.

(10) Patent No.: US 9,419,658 B2
(45) Date of Patent: Aug. 16, 2016

(54) DIGITAL MODULATOR NON-LINEARITY CORRECTION

(71) Applicant: Infineon Technologies AG, Neubiberg (DE)

(72) Inventors: David Seebacher, Villach (AT); Peter Singerl, Villach (AT); Christian Schuberth, Villach-Landskron (AT); Martin Mataln, Velden (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/580,847

(22) Filed: Dec. 23, 2014

(65) Prior Publication Data

US 2016/0182098 A1 Jun. 23, 2016

(51) Int. Cl.
| | |
|---|---|
| *H04L 25/03* | (2006.01) |
| *H04L 25/49* | (2006.01) |
| *H04B 1/04* | (2006.01) |
| *H04B 1/62* | (2006.01) |

(52) U.S. Cl.
CPC ............ *H04B 1/0475* (2013.01); *H04B 1/0483* (2013.01); *H04B 1/62* (2013.01); *H04B 2001/0425* (2013.01)

(58) Field of Classification Search
CPC ...... H04B 1/0475; H04B 1/0483; H04B 1/62; H04B 2001/0425

USPC .......................................................... 375/296
See application file for complete search history.

(56) References Cited

U.S. PATENT DOCUMENTS

| | | | |
|---|---|---|---|
| 5,778,029 A * | 7/1998 | Kaufmann | 375/296 |
| 2013/0163697 A1* | 6/2013 | Moser | 375/300 |
| 2014/0002192 A1 | 1/2014 | Seebacher et al. | |
| 2014/0062604 A1 | 3/2014 | Seebacher et al. | |

OTHER PUBLICATIONS

Pieter A. J. Nuyts, et al.; "A Fully Digital Delay Line Based GHz Range Multimode Transmitter Front-End in 65-nm CMOS"; IEEE Journal of Solid-State Circuits, vol. 47, No. 7, Jul. 2012, p. 1681-1692.
Ashoke Ravi, et al.; "A 2.4-GHz 20-40-MHz Channel WLAN Digital Outphasing Transmitter Utilizing a Delay-Based Wideband Phase Modulator in 32-nm CMOS"; IEEE Journal of Solid-State Circuits, vol. 47, No. 12, Dec. 2012, p. 3184-3196.

* cited by examiner

*Primary Examiner* — David B. Lugo
(74) *Attorney, Agent, or Firm* — Eschweiler & Associates, LLC

(57) ABSTRACT

A nonlinear distorter is configured to mitigate nonlinearity from a nonlinear component of a nonlinear system. The nonlinear distorter operates to model the nonlinearity as a function of a piecewise polynomial approximation applied to segments of a nonlinear function of the nonlinearity. The nonlinear distorter generates a model output that decreases the nonlinearity of the nonlinear component.

22 Claims, 14 Drawing Sheets

DIGITAL MODULATOR NON-LINEARITY CORRECTION

FIELD

The present disclosure relates to modulators, and more specifically, to correcting driver non-linearity in digital modulators.

BACKGROUND

Nonlinearity is inherent in most systems confronting scientific endeavors, and presents particular challenges to a wide array of scientific fields. Nonlinearity, applies to nonlinear digital pre- and post-distortion schemes of nonlinear components or nonlinear systems with memory, such as power amplifiers for wireless-, wireline-, or optical-fiber communication. Primary problems caused by system components exhibiting nonlinearity or dynamic nonlinearity (i.e. nonlinear behavior with memory) are out-of-band emissions and in-band distortion, which lead to design problems such as low energy efficiency and degraded performance. Non-linear distortion schemes attempt to mitigate the unwanted effects resulting from out-of-band emissions and in-band distortion by attempting to modify (pre- or post-distorting) input or output signals of nonlinear systems. In particular, radio frequency (RF) pulse width modulation (PWM) generation includes a driver circuit or other component involved in signal processing causes nonlinear behavior of the driver due to a limit on rise and fall times, as well as other associated effects. In order to provide a high quality output signal for communications, these nonlinear effects should be compensated.

DETAILED DESCRIPTION

Figure 1:
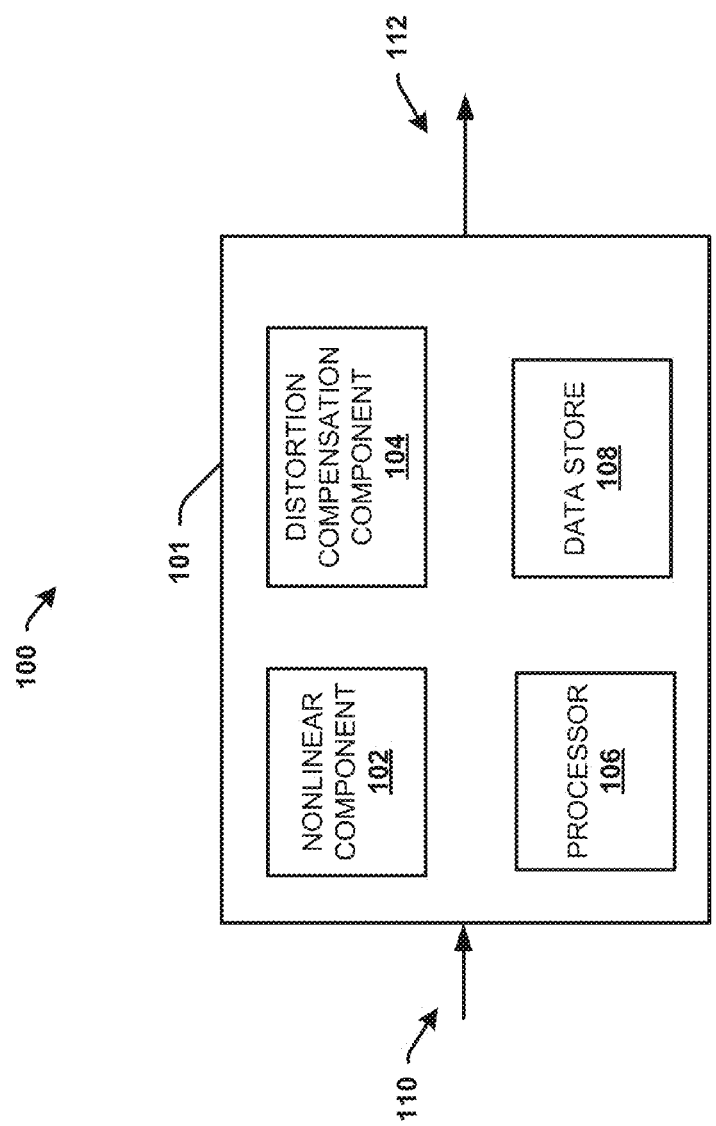
FIG. 1 illustrates a block diagram of a nonlinear system for compensating nonlinearity according to various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies of nonlinear systems, various aspects for mitigating the nonlinearity of different nonlinear components (e.g., power amplifiers, digital or analog transmit or receive chain components, hybrid digital and analog components, or other nonlinear devices) are disclosed. Nonlinear distortion components (e.g., pre-distortion or post-distortion components), systems, schemes or combinations thereof are disclosed to compensate unwanted effects arising from nonlinear behaviors with or without memory such as from out-of-band emissions or in-band distortions. The nonlinear distortion systems disclosed can modify input or output signals of nonlinear components (e.g., an amplifier driver, a modulator, or the like) by considering adjacent pulses between data samples, whose lengths are dependent on the output signal of both sampling instances. Driver nonlinearity, for example, can applied to individual digital pulses, such as on each single pulse to compensate, correct, or mitigate nonlinearity being generated by any one nonlinear components of a system. In some embodiments, compensating for such nonlinearity includes taking into account adjacent pulses that can become distorted as a result of distortion, and if the signal of a current sample is only taken into account, then improvement processes by pre-distortion or post-distortion can be limited as a result of errors caused by adjacent pulses. In particular, the systems and components being disclosed herein generate distortion compensation to individual pulses, such as at each pulse of each sample, while also taking into account effects that carry over into adjacent pulses (prior to or subsequent to any one particular digital pulse). Thus, not only the current sample, but also the previous and the next/subsequent sample are taken into account when compensating for nonlinearity. Advantages are incurred as a result of processes disclosed that significantly increase signal quality for signal processing, particularly for wideband signal with rapidly varying sampling values.

In one example, a communication system comprises a memory storing executable components and a processor, coupled to the memory, configured to execute the executable components. The executable components comprise a modulator component (e.g., a modulator, an RF modulator, an RF PWM modulator, a digital driver, a power amplifier, or other component of a communication or a digital modulation system) that is configured to receive an input signal, and generate digital pulses corresponding to time periods of a local oscillator. The modulator component further generates a modulated output signal (e.g., an amplified driver output or other modulator output of the system) that comprises a nonlinearity, or a nonlinear signal. A distortion compensation component is configured to generate a distortion compensation that corresponds to a particular digital pulse of the digital pulses within a particular individual time period. The distortion compensation component, for example, operates to correct sample data within the first time period of the plurality of time periods to compensate the nonlinearity by considering the effects of adjacent digital pulses and adjacent pulse period times.

A problem can be demonstrated as a result of sample alone pre-distortion, in which adjacent pulses are not taken into account or, in other words, compensation is generated on a per sample basis (e.g., distortion including a set of multiple digital pulses at once). In generation of the desired digital pulses, multiple edge transitions can occur within a single time period, oscillator period, or carrier period. Because components of the modulator can be limited with an update rate to the carrier frequency (e.g., a driver or a power amplifier), the components do not generate a signal that reflects three signal transitions, and thus nonlinearity is generated and uncompensated for.

Consequently, compensating for the individual errors for each digital pulse enables a significant decrease in the non-linearity effects as opposed to distorting (e.g., pre-distorting) sampled data only according to the effects of each sample. Additional aspects and details of the disclosure are further described below with reference to figures.

FIG. 1 illustrates an overview example for disclosure of a nonlinear system that generates nonlinearity and compensates for the nonlinearity according to various aspects. The system 100 comprises a communication device 101 comprising a nonlinear component 102 that generates nonlinearity characteristics in operation or in the output. The system 100 further comprises a distortion compensation component 104 that operates to generate an output signal to improve the output of the nonlinear component 102 with more desirable properties by compensating the nonlinearity at an individual pulse level, rather than at a broader sample level.

The communication device 101 can receive one or more input signals 110 (e.g., RF signals), sample the received signals, modulate the signals with signal processing components and a driver, and output a modulated output signal. The nonlinear component 102, for example, can comprise a modulator, a driver or an amplifier such as a power amplifier for wireless, wireline, or optical-fiber communication. In other examples, the nonlinear component 102 can comprise an analog or a digital component of a communication transceiver, or a hybrid circuit component that separates transmit and receive signals. In particular, the nonlinear component 102 can comprise any device or component that operates with, or generates an output having nonlinearity or distortion compensation components.

The nonlinear component 102 can exhibit or generate different degradation elements such as nonlinearity distortion, linear distortion, and a nonlinear memory effect, in which the nonlinearity distortion or the nonlinear memory effect can be referred herein as nonlinearity, and the behavior of which can be described according to one or more nonlinearity functions. Specifically, the nonlinear distortion refers to a waveform distortion caused by nonlinear characteristics of a system, device circuit or component with respect to an input or input amplitude, such as AM (amplitude modulation) AM and AM-PM (phase modulation) characteristics. Linear distortion can refer to the waveform distortion caused by linear frequency characteristics of the circuit (frequency characteristics appearing in a component of a signal), and the nonlinear memory effect refers to the waveform distortion caused by a mutual relation between the nonlinear characteristics of the nonlinear component 102 and various frequency characteristics of the system 100 (frequency characteristics appearing in a distortion compensation component), for example. In a simple amplifier model, for example, utilizing only the nonlinear distortion (AM-AM and AM-PM characteristics), an output of the amplifier or of the nonlinear component 102 can be uniquely determined by the current input 110. However, when the linear distortion or the memory effect is present, in terms of a time domain, the output of the amplifier can be related, not only to the current input, but also to a previous input, previous state, and/or a previous output of the amplifier.

The system 100 comprises a distortion compensation component 104, a processor 106 and a data store 108. The distortion compensation component 104 operates to generate a nonlinear correction within an individual time period that mitigates, compensates or corrects for the nonlinearity of the nonlinear component 102. The distortion compensation component 104 thus operates on a per digital pulse basis to correct for the distortion or nonlinearity being generated. The nonlinear corrections are generated by the distortion compensation component 104 based on a contribution amount of digital pulses to the nonlinearity within a current or an individual time period.

A sample of data generated by the communication device 101, for example, can include multiple different digital pulses or a digital pulse train/sequence based on the input signal 110 (e.g., an RF baseband signal or the like). The data outputted by the device 101 at an output terminal 112 can be processed and fed back into the pre-distorter (now shown) of the distortion component that distorts the signal in an inverse operation, for example, to counteract the known nonlinearity. Errors, however, can be generated that facilitate further nonlinearity or inefficient countermeasures. As such, the distortion compensation component 104 is configured to generate distortion compensation or correction on each digital pulse within each digital pulse period to compensate for these different errors among the digital time periods of the data sample. For example, the distortion compensation component 104 takes into account digital pulse lengths that extend across more than one time period and factors adjacent pulses into the compensation of each individual digital pulse. The compensation generated by the distortion compensation component 104 can thus operate to re-allocate or redistribute the errors along the digital pulses in order to generate the desired signal output at the output 112, with a decrease in a nonlinearity noise floor of the nonlinearity.

For example, the distortion compensation component 104 identifies carryover regions of digital pulses that overlap two different time periods. These carryover regions can interfere with the data sample of a current time period and not be completely account for in the generation of output 112 because a signal derived from the overlapping data or additional transition edges is difficult to generate by the nonlinear component 102 (e.g., a modulator, a driver component, etc.). The distortion compensation component 104 further compensates for these overlapping time periods in order for them to be accounted for more efficiently in the generation of the output 112 from the nonlinear component 102. For example, each individual pulse can be corrected or compensated by shifting, distributing, or re-allocating the error from the overlapping regions of adjacent pulses to other digital pulses, such as other adjacent digital pulses, for example.

Figure 2:
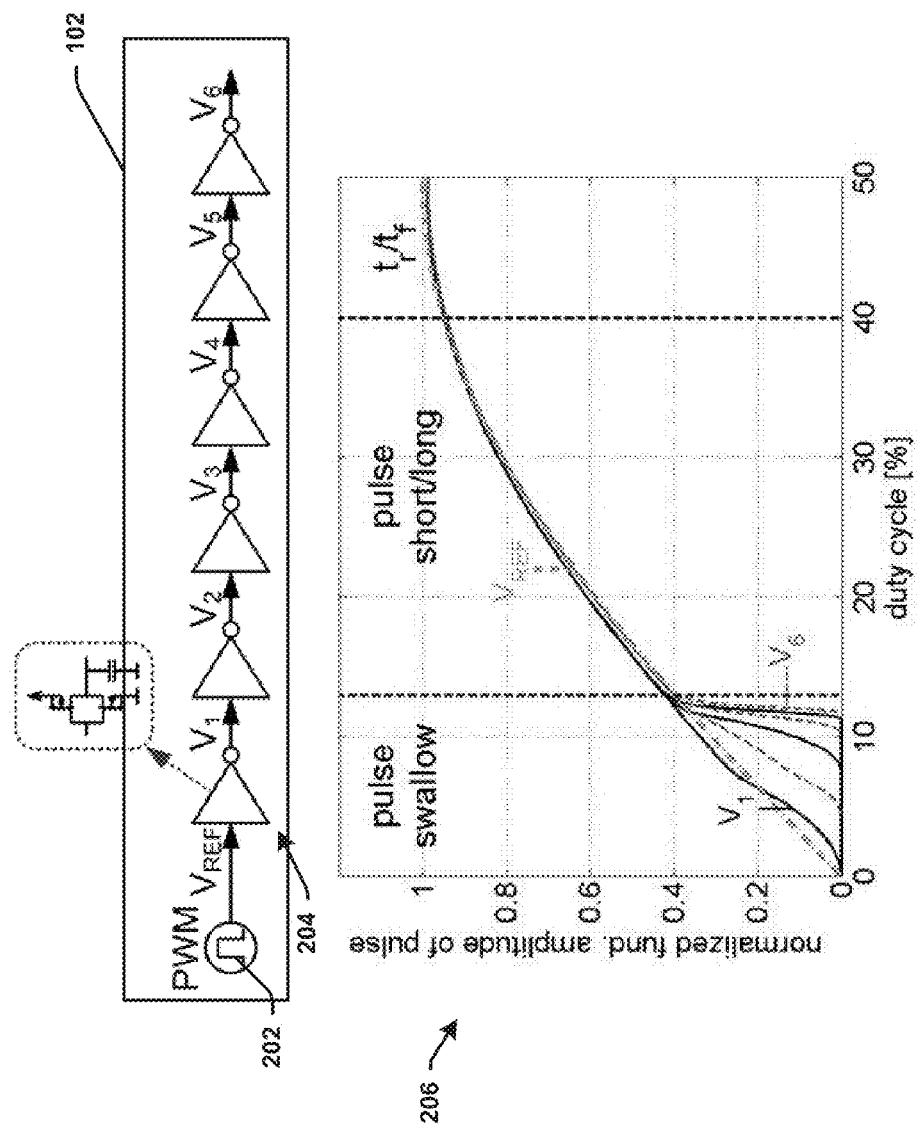
FIG. 2 illustrates a block diagram of an example nonlinear component of a nonlinear system and a graph demonstrating nonlinear distortion according to various aspects described.

Referring to FIG. 2, illustrated is an example of a nonlinear component 102 and a corresponding amplitude characteristics graph 206 in accordance with various aspects. For example, the nonlinear component 102 can comprise a modulator component such as a driver 204 configured to receive a modulator input signal from a plurality of digital pulses at a plurality of time periods from a pulse source 202 for an RF PWM signal, and generate a modulated output signal that comprises a nonlinearity. The driver 204 can comprise a digital driver chain that comprises a line of one or more inverter stages, for example, that have inherent parasitic effects or parasitic structures/devices that exhibit parasitic effects.

For example, each driver or inverter stage 204 has a parasitic capacitance at its input and output that causes a limited rise and fall time of the signal being processed. The impacts of the limited rise and fall times act differently, depending upon a duty cycle of the generate signal, as can be seen in a duty cycle characteristic graph 206, which is divided into three stages of the duty cycle—a pulse swallow stage, a pulse short/long stage and rise and fall time stage, in which a fundamental frequency is not able to reach a maximum threshold.

For very low duty cycles, the pulse at the output of a single inverter stage (e.g., $V_1$, $V_2$, $V_3$, $V_4$, $V_5$, $V_6$, etc.) eventually fails to obtain or reach a maximum value anymore due to the limited rise and fall times. This results in a distortion of the fundamental frequency component, as illustrated. In addition, the a result can be that the input switching threshold of a next inverter stage is not reach anymore, and thus the pulse disappears or is swallowed, which is more pronounced the higher the number of inverter stages involved. In the intermediate duty cycle region, the pulse shortening/extension effect dominates the nonlinear behavior. If the driver experiences different rise and fall times, the switching delay is different for the rising and falling edges, which results in longer/shorter pulses after each stages depending upon the rise/fall time relationship. For larger duty cycles, the real driver deviates from the theoretical one ($V_{REF}$), as the maximum fundamental amplitude cannot be reached anymore due to the finite rise and fall time of the signal.

Figure 3:
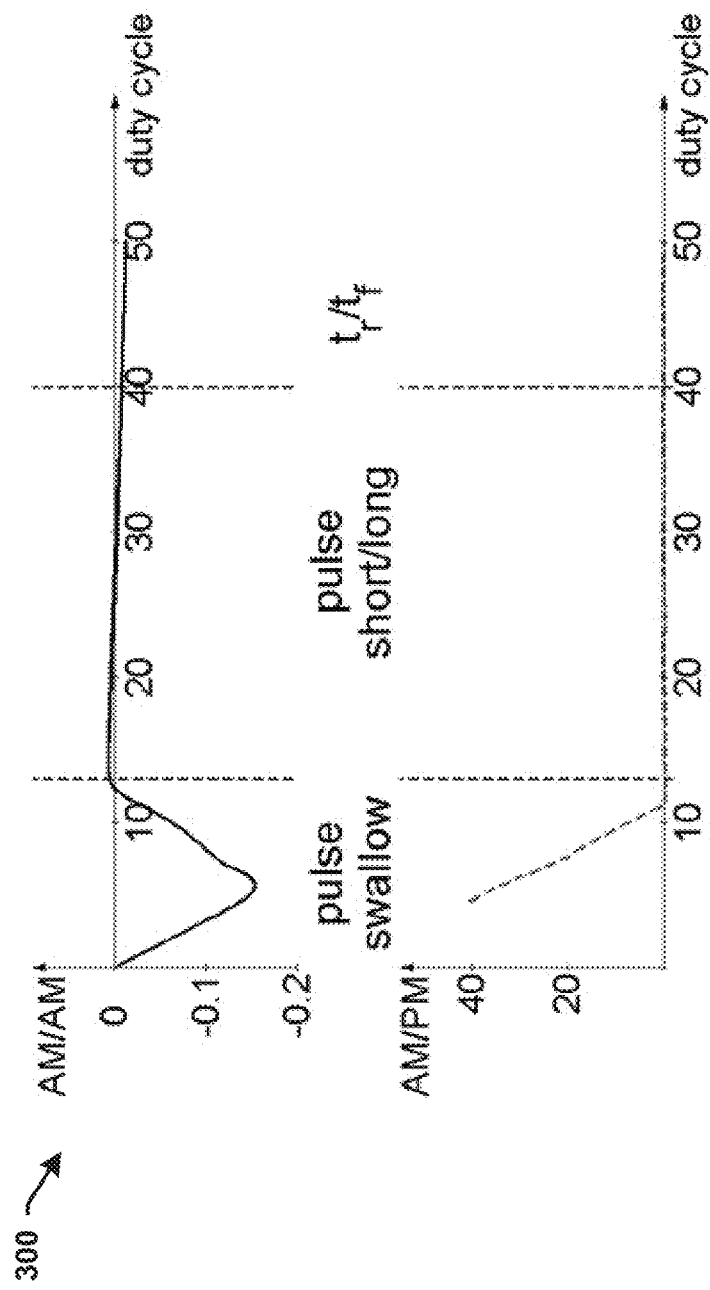
FIG. 3 illustrates a graph illustrating effects of nonlinear distortion according to various aspects described.

Referring to FIG. 3, illustrated is example graphs of AM/AM and AM/PM characteristics in accordance with various aspects being described. The graphs 300 illustrate AM/AM and AM/PM characteristics after two inverters stages of the inverter stages 204 of FIG. 2, for example. The graphs 300 illustrate that in addition to the amplitude distortion also a significant phase distortion in the pulse swallowing region exists. As such nonlinear driver behavior significantly limits the performance of a RF PWM modulator, for example, and compensation of the nonlinear behavior is required to regain highest performance.

Figure 4:
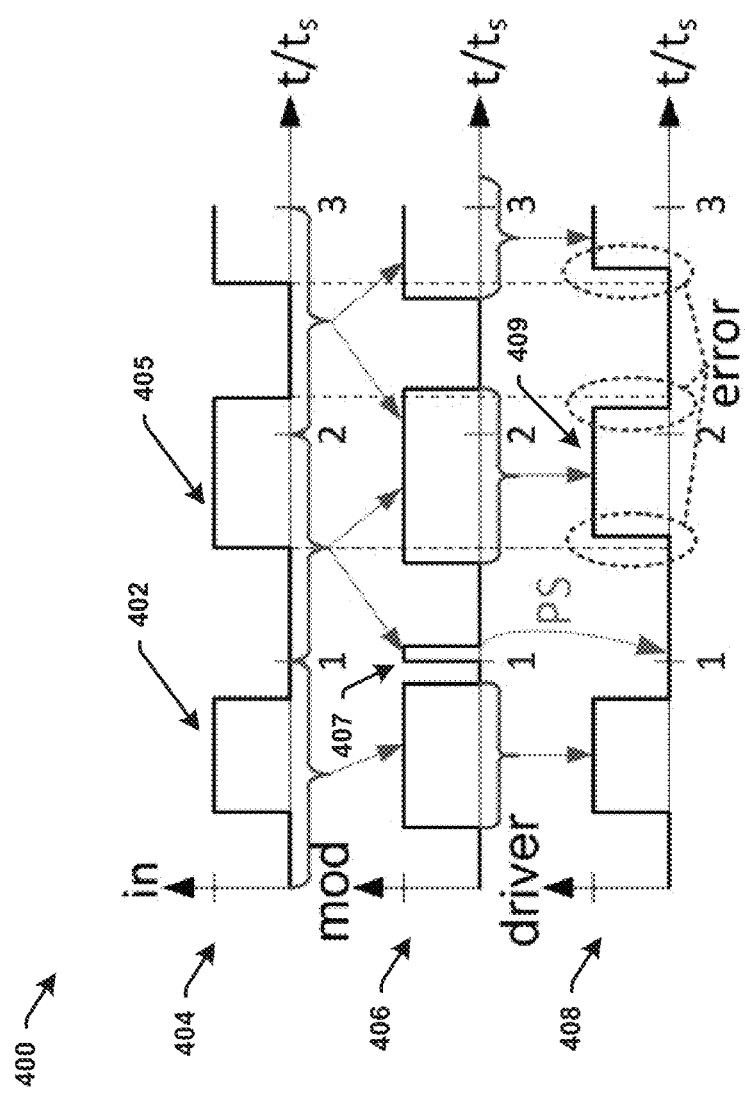
FIG. 4 illustrates an example of waveforms of a nonlinear system according to various aspects described.

Referring to FIG. 4, illustrated is an example of waveforms 400 of a data sample according to various aspects. Rather than correct the nonlinearity through pre-distortion techniques on a per sample basis, system 100, for example, operates to correct nonlinearity on an individual pulse basis. In the context of wideband digital RF PWM signals, generating correcting operations or compensation for the nonlinearity on a sample basis is not sufficient alone to achieve an optimal signal quality. For example, the waveforms 400 illustrate a sample based pre-distortion example for a rapidly varying wideband signal. The waveform 404 represents input signals to a pre-distortion component coupled to a modulator, for example. The waveforms 406 represent an output of the modulator to a driver, for example, and the waveforms 408 represent an output of the driver. Due to the circular nature of an RF PWM modulator, for example, the generated pulses could cover more than a single carrier period. This occurs and can be seen, for example, during the transition from period two to period three for the desired input signal "in" 404 of FIG. 4. Applying the pre-distortion on a per sample basis, meaning that only content within the sampling period is actually considered, rather than overlapping or adjacent data, can result in errors, especially if a digital pulse is extended from a current period to adjacent samples within adjacent periods, for example.

In one example, applying pre-distortion on a per sample basis, rather than on a per pulse basis, or a per period basis, can be seen in periods two and three of FIG. 4. During the second and the third period, only a contribution of the corresponding sampling periods is considered. For the second period (i.e., between '1' and '2' in time t/ts), the pre-distorted pulse 406 generated by the modulator (mod) contains a very short (unintended) pulse 407 at its beginning due to the circular shifting properties of the modulator implementation. This short pulse 407 is swallowed or pulse swallowed (PS) in the driver chain, and thus given no affect in the driver output waveform 408. In addition, the correction in the second period, only the length of the pulse 405 starting from the rising edge until the end of the second period is considered. As the real pulse is actually longer, the pre-distortion generates a wrong correction signal. During the third period similar effects happen, as the actual pulses are adjacent to the other sampling periods the pulse length considered for pre-distortion can be different from the actually generated one (especially for rapidly varying signals). As a result the signal 408 after the driver nonlinearity (in which the driver operations apply on a per-pulse basis, rather than only a per sample/carrier period basis) can differ from the desired modulation signal 404.

Figure 5:
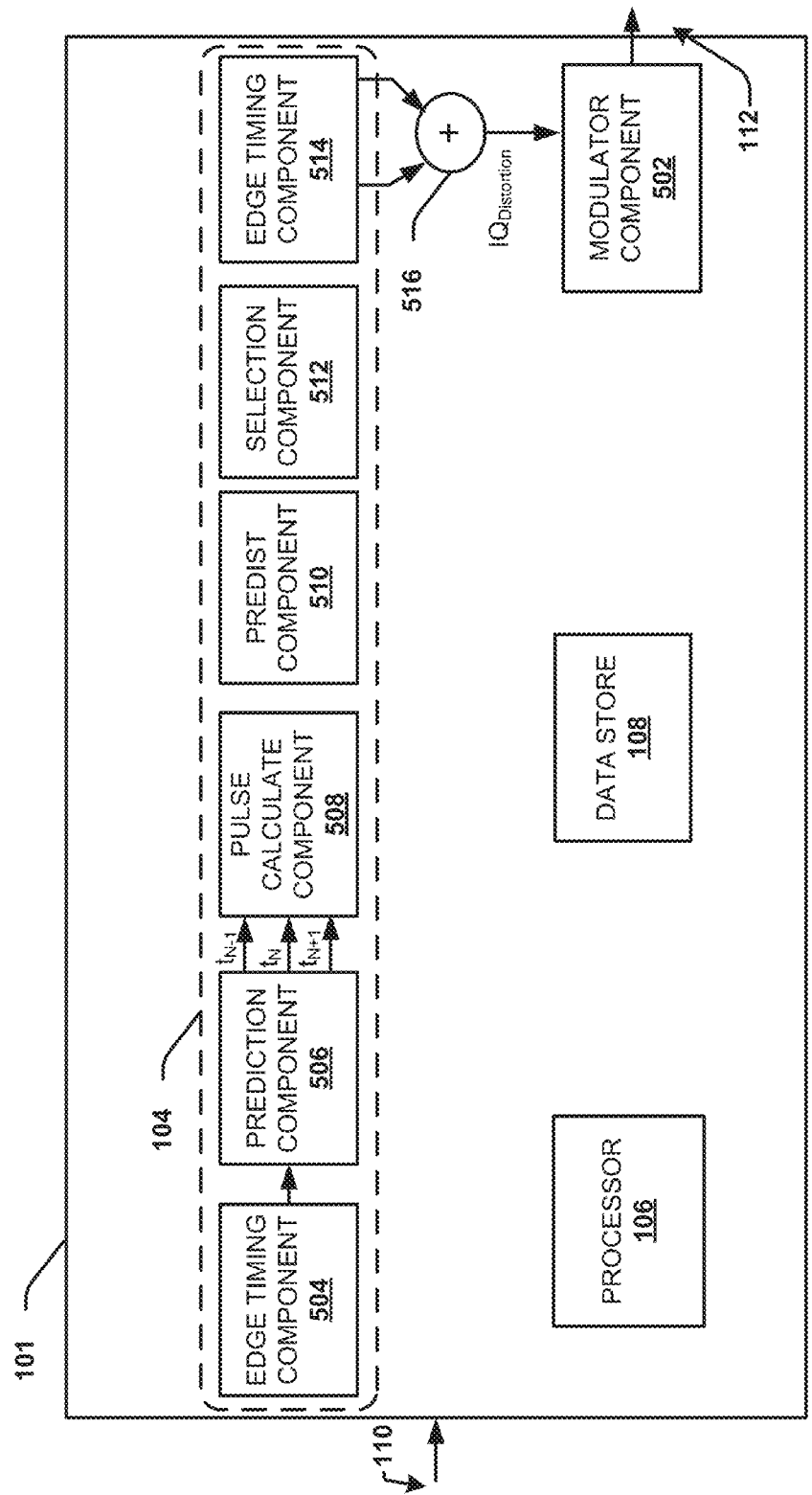
FIG. 5 illustrates another block diagram of a nonlinear system for compensating nonlinearity according to various aspects described.

Referring to FIG. 5, illustrated is an example modulator device or communication device 101 according to various aspects. The modulator device 101 operates to receive the input signal 110 (e.g., RF baseband signal, an in-phase/quadrature phase baseband signal or other received signal) modulates the input signal 110 and generates an output 112. To mitigate nonlinear behaviors inherent in the device 101 or device components, such as the modulator component 502, the nonlinear compensation component 104 processes the input signal 110 and analyzes specific, individual digital pulses within timing boundaries of individual timing periods. Based on the conditions of each set of data within a timing period or oscillator period, for example, each digital pulse is compensated for and adjacent pulses are taken into account in order to ensure efficient processing within the modulator component 502.

For example, as a result of sample alone pre-distortion, in which adjacent pulses are not taken into account or, in other words, compensation is generated on a per sample basis only, multiple edge transitions can still occur within a single time period, oscillator period, or carrier period. Because components of the modulator can be limited with an update rate to the carrier frequency, the components have difficulty in generating a signal that reflects three signal transitions within a single carrier period, or a single time period, for example.

Figure 6:
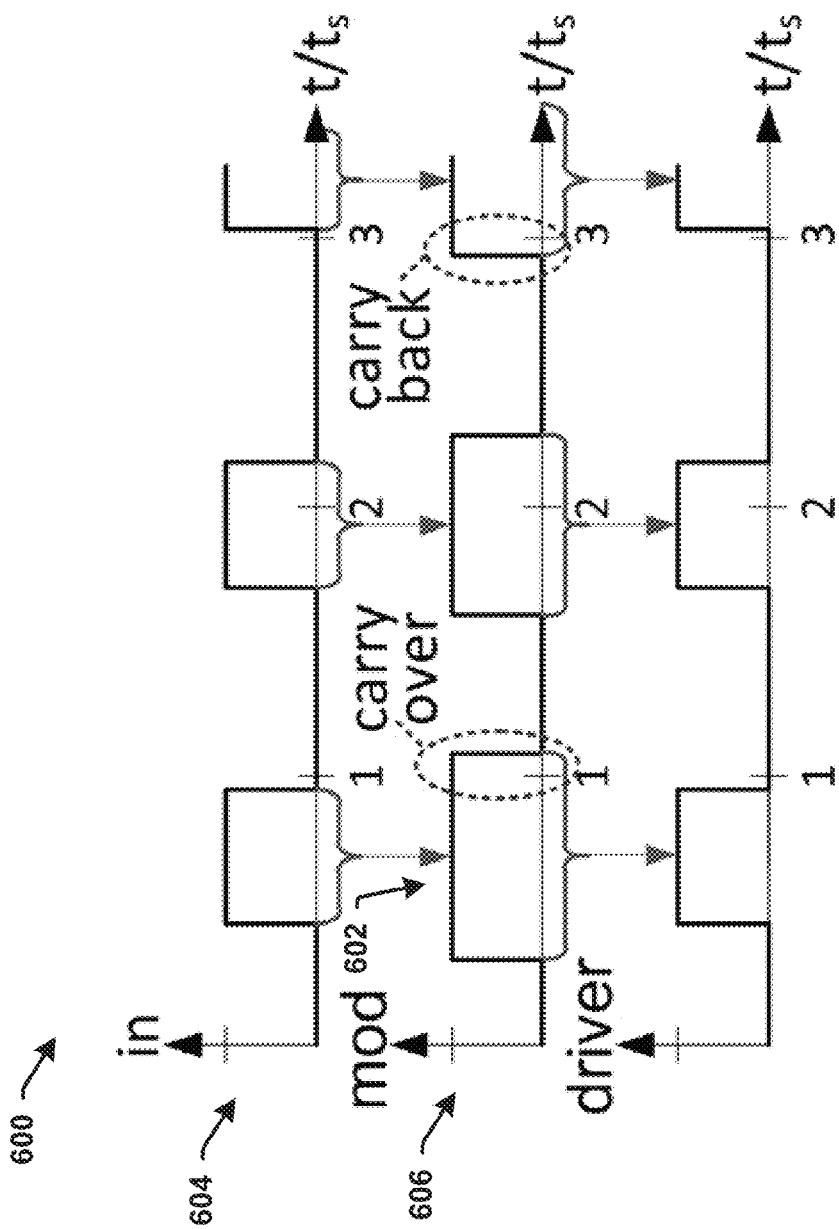
FIG. 6 illustrates another example of waveforms of a nonlinear system having carryover regions in digital pulses according to various aspects described.

The distortion compensation component 104 is configured to generate a compensation or correction of the distortion or nonlinearity from the modulator component 502 by detecting one or more carryover regions of digital pulses from the boundaries of one time period and another time period. The distortion compensation component 104 therefore generates and applies the distortion compensation to individual digital pulses of the plurality of digital pulses to compensate the nonlinearity in way that accounts of these overlap regions. In one example, referring briefly to FIG. 6, illustrated is an example of carryover regions of digital pulses 600 within the modulator wavelengths before being inputted or received by a driver.

In order to perfectly compensate for the driver effects, the distortion compensation component 104 can generate a compensation via a pre-distortion that is applied on a per pulse basis, such that each pulse is corrected individually. The distortion compensation component 104 considers each desired pulse (in) 604 individual for pre-distortion, for example, and corrects each digital pulse accordingly. After the pre-distortion, either as an input 604 to the modulator component 502 or component therein (e.g., the driver), a digital pulse of the digital pulses 606 could be detected by the distortion compensation component 104 to extend or reach into the next/subsequent period or pulse in time, or the previous sample or period in time. This effect can be seen for the pulse 602 at the end of period one, which is extended to the second period after pre-distortion in the digital pulses 606 to the modulator component 502. These effects in general can be referred to as a carryover, in which a digital pulse that carries over into the next/subsequent period can be considered a "carryforward". The same effect can also happen in the reverse direction as indicated in period four, where the pulse is extended to reach into period three. This is referred to as "carry back".

It can be seen that the signal after the driver shows the desired waveform and no error occurs as a result of operation generated by the distortion compensation component 104. During the signal generation for each sample, the distortion compensation component 104 thus factors the (possible) contribution of adjacent samples, in which this process can be considered a carryover based pre-distortion to mitigate nonlinear in nonlinear digital components of a system.

In one aspect, the distortion compensation component 104 operates to detect the carryovers, or predict the carryovers via the generation of the digital pulses in the sample and reallocates these carryover regions to a different digital pulse in order to share the error. This enables a sharing of the error and decreases the detection or effect of nonlinearity over each digital pulse. For example, an adjacent portion of an adjacent digital pulse with respect to each period or pulse timing can be shared with a different digital pulse of the plurality of digital pulses. In this manner, a desired output signal that reflects the input signal more uniformly is able to be dynamically shaped by the distortion compensation components 104.

Referring back to FIG. 5, the distortion compensation component 104 comprises a first edge timing component 504, a prediction component 506, a pulse calculate component 508, a pulse pre-distortion component 510, a selection component 512, a second edge timing component 514 and an adder component 516. The first edge timing component 504 receives the input signal 110 and converts an in-phase/quadrature phase (I/Q) baseband signal into desired digital pulses.

The prediction component 506 is located downstream of the first edge timing component 504 and predicts an upcoming pulse in order to account for any "carryback" contribution from any subsequent pulses. The prediction component 506 predicts a subsequent digital pulse to factor a carryback contribution of the subsequent digital pulse that overlaps into the current period of the currently analyzed digital pulse, for example. If one sample or digital pulse delay can be accepted to compensate the error, the prediction component 506 can provide a delay that will be generated at the detected carryback region (e.g., $t_{n-1}$, $t_n$, $t_{n+1}$). The pulse calculate component 508 is configured to then generate a sample delay to the plurality of digital pulses based on the predicted subsequent digital pulse, for example.

The pulse pre-distortion component 510 is located downstream of the pulse calculation component 508 and receives the delayed pulses. The pulse pre-distortion component 510 is configured to generate a compensation such as a pre-distortion of the individual digital pulses, for example, based on a pulse timing of a previous digital pulse, the current digital pulse being analyzed, and the subsequent digital pulse. The pre-distortion of each, single, digital pulse can be based on a look up table of nonlinear coefficients or other factors that correspond, for example, to an inverse of the nonlinearity compensation for a digital pulse, or could, alternatively or additionally, include one or more processes (e.g., polynomial approximations, or the like) that also consider memory or memory effects (e.g., memory polynomials, or other memory effects).

The selection component 512 is configured to select one or more portions of the plurality of digital pulses within a time period or within boundaries of pulse timings. The carryover regions, such as a carry forward region or a carryback region of an adjacent pulse or the current pulse can be selected. The second edge timing component 514 then converts the digital pulses back into I/Q data. An adder component or an adder 516 then operates to selectively redistribute, reallocate or add the selected one or more portions of the digital pulses to adjacent pulses for each timing period of digital pulses. The selected portions, for example, are then added into the I/Q data.

Figure 7:
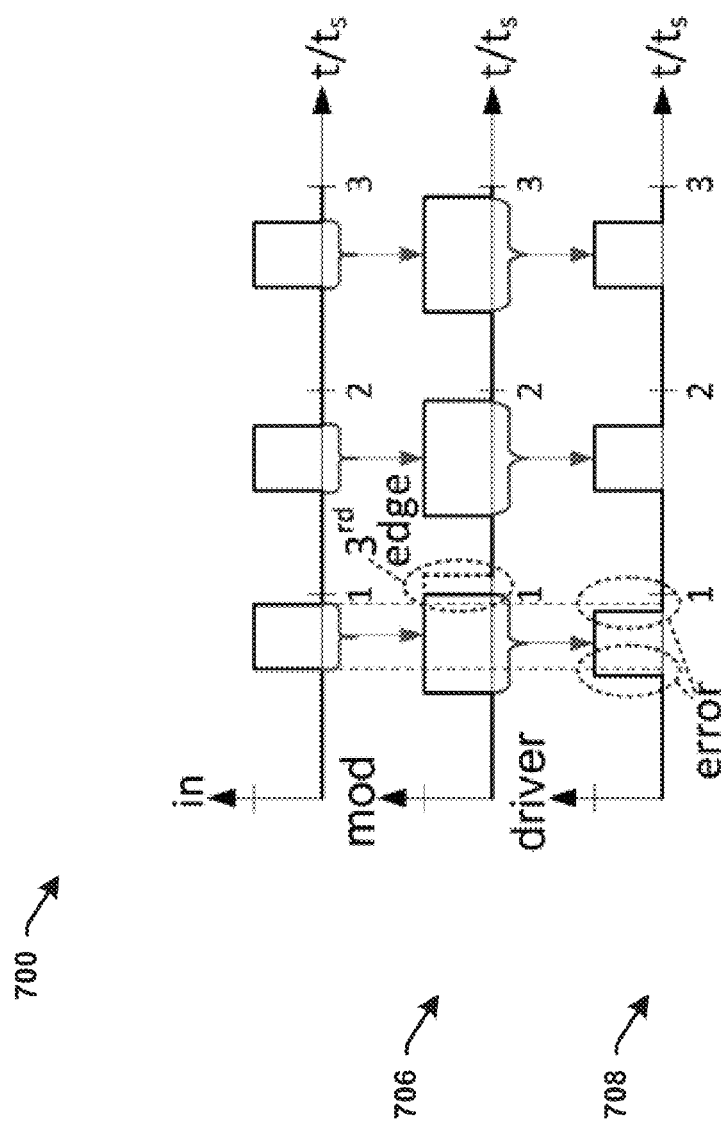
FIG. 7 illustrates another example of waveforms of a nonlinear system according to various aspects described.
Figure 8:
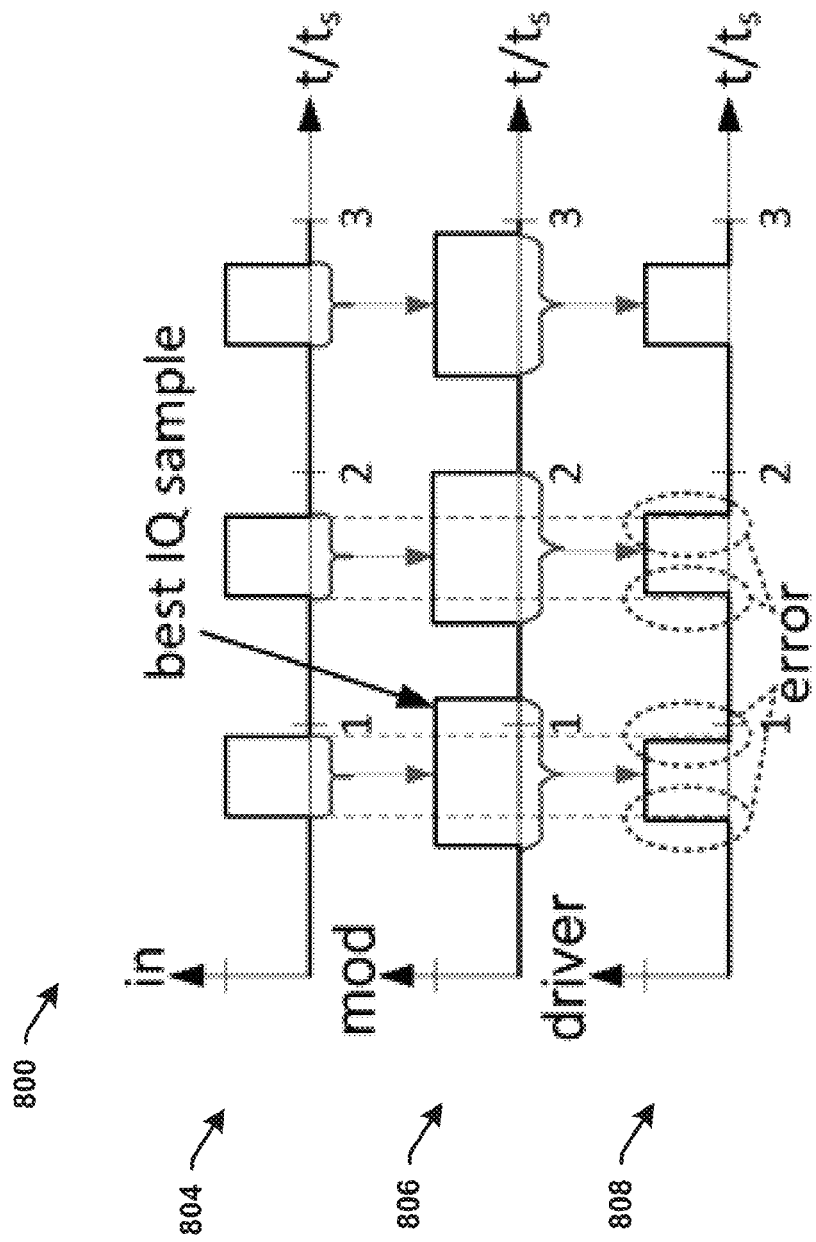
FIG. 8 illustrates another example of waveforms of a nonlinear system according to various aspects described.

Referring now to FIGS. 7-8, illustrated are waveforms 700 for comparison that demonstrate a difference in the error as a result of the adder component in accordance with various aspects being described. For example, FIG. 7 illustrates an example of the occurrence of three signal transitions that occur, for example, during the second period of the modulated input waveforms 706 from the input waveform 704, in which the dotted edge portion is included in the generation of the modulated waveforms as extending into the second period as a carryforward region. This signal cannot be generated by the modulator as driver output 708. By simply ignoring the carry over contribution, the resulting pulse (driver) 708 during the first period shows some errors, as circled in dotted ellipses. As for this case, the "rounding error" is always single sided, the spectral contribution is correlated to the signal, which results in an increase of the in-band noise floor and to the nonlinearity.

However, FIG. 8 illustrates an example of the operations generated by the distortion compensation component 104. The adder component 516, for example, operates with the other components to prevent these errors and to find an optimum output signal 808 within the constraints of the modulator component 502. For example, the single pulse's contribution is added in the IQ domain. In FIG. 8 the additive IQ calculation for the same situation as depicted in FIG. 7 is shown. By comparison of FIGS. 7 and 8, the contribution of the $3^{rd}$ signal edge at the beginning of the second period in the modulation waveforms 806 is added to the contribution of the second pulse within the second period. This delivers a signal that is closest to the desired IQ value (of the current sample) as demonstrated by the input waveform 804, but exhibits only two signal transitions within the second carrier period as seen in the modulator waveforms 806. As a result the error is minimized and spread equally amongst the pulses concerned in the output 808 of a driver or other nonlinear component. In the spectral domain, this additive correction results in a noise shaping similar to a type of delta sigma noise shaping, which shifts the contribution of the error out of the signal band. The distortion compensation component 104 is thus able to compensate for errors that are the source of further distortion by ensuring that less than three signal edges occur within a period through a dynamic reallocation of adjacent overlapping pulses or carryover portions of digital pulses.

Figure 9:
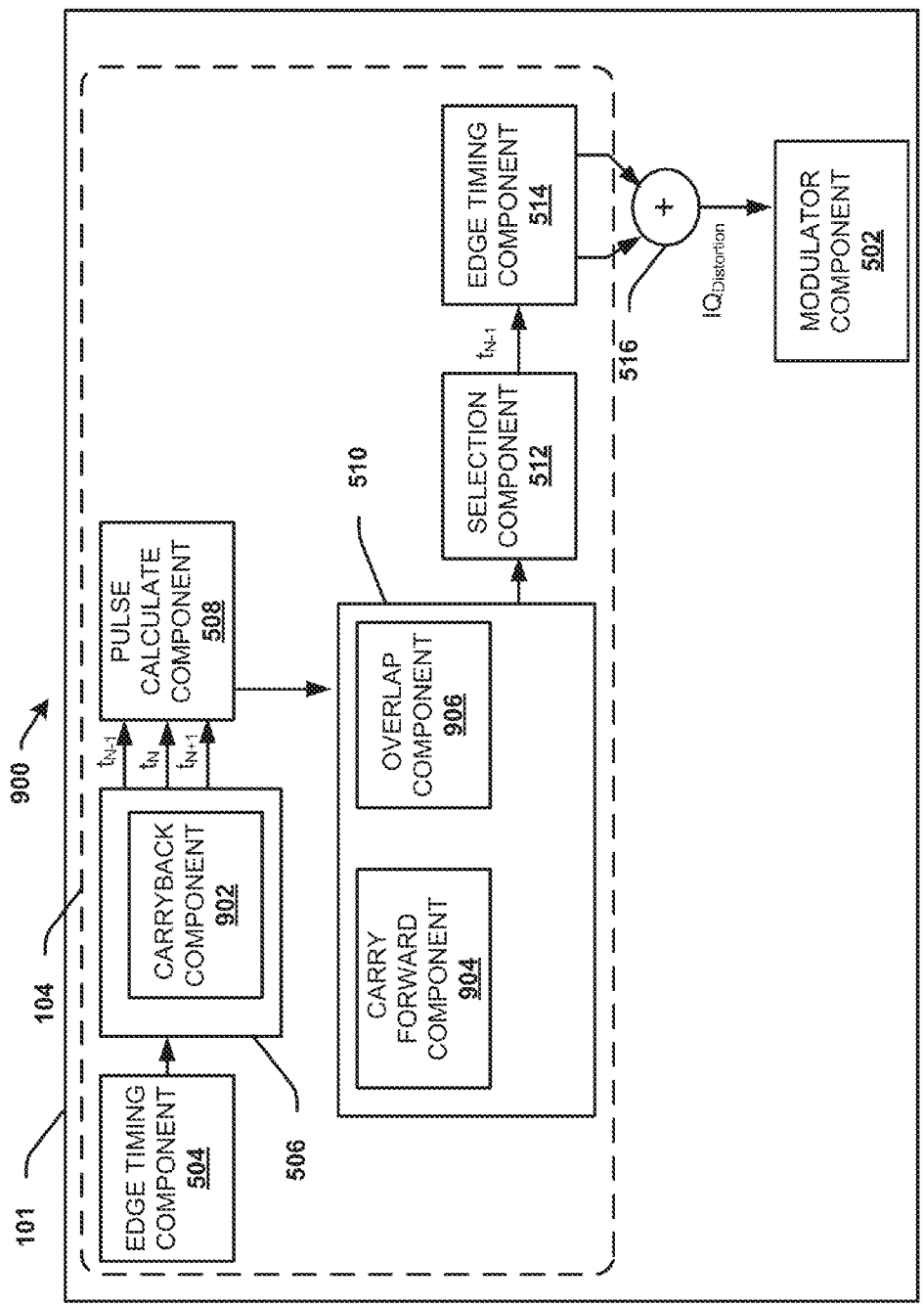
FIG. 9 illustrates another block diagram of a nonlinear system for compensating nonlinearity according to various aspects described.

Referring to FIG. 9, illustrated is an example of a nonlinear system in accordance with various aspects described herein. The nonlinear system 900 comprises similar components as discussed above, and further comprises a carryback component 902, a carryforward component 904, and an overlap component 906.

In one example, the prediction component 506 comprises the carryback component 902. Alternatively or additionally, other components could comprise the carryback component 902. The carryback component 902 is configured, for example, to detect a carryback of a subsequent digital pulse that overlaps or carries over into the current time period being analyzed or processed for distortion compensation. In addition, the prediction component 506 operates to predict an upcoming pulse in order to account for any "carryback" contribution that is detected by the carryback component from a subsequent digital pulse. In response to a sample or digital pulse delay able to compensate the error derived from an carryover, the prediction component 506 provides a delay that will be generated at the detected carryback region (e.g., $t_{n-1}$, $t_n$, $t_{n+1}$). The pulse calculate component 508 then operates to generate a sample delay to the plurality of digital pulses based on the subsequent digital pulse, for example.

The pre-distortion component 510 or other component of the distortion compensation component 104 can comprise a carryforward component 902 that is configured to detect a carryforward of a current digital pulse that overlaps from a current time period into a subsequent time period along the digital pulses of the data sample. The carryforward region is identified that crosses over into the next time period, which can then be approximated or selected in order for a reallocation the carryforward region by downstream components such as the selection component 512, or the adder component 514. Thus, the pre-distortion component 510 can generate a compensation of the individual digital pulses based on a pulse timing of a previous digital pulse, the current digital pulse being analyzed, and the subsequent digital pulse by taking into account carryover data from the carryback component 902 and carryforward component 904.

The pre-distortion component 510 can further comprise the overlap component 906, which is configured to detect an overlap in at least two digital pulses of the plurality of digital pulses. An overlap, for example, can include an overlapping region of two digital pulses, or include a region that is in a close proximity among at least two digital pulses relative to other digital pulses of digital pulses. The adder component 516 can then add the contributions of the at least two digital pulses to form a unified single pulse in order for the modulator device or communication device to account for each contribution of each pulse, and prevent the overlap portions (either over one another or close in proximity) from being unaccounted for in the processing operations.

Figure 10:
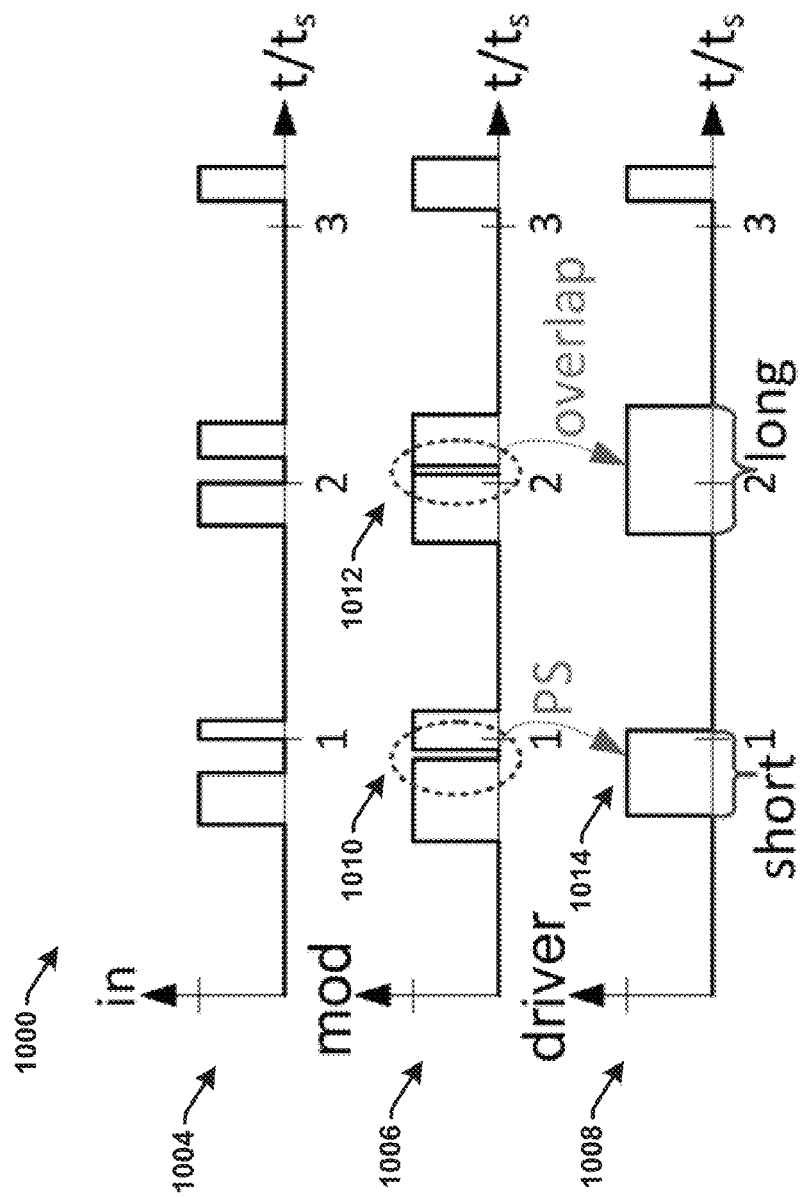
FIG. 10 illustrates another example of waveforms of a nonlinear system according to various aspects described.

FIG. 10 illustrates an example of waveforms comprising an overlap according to various aspects. For example, the input waveform 1004 to the distortion compensation component 104 that corrects or compensates for nonlinearity generated by the nonlinear component 102 is processed and provided to a modulator or the nonlinear component 102 as a distorted signal waveform or a modulator (mod) waveform 1006, which can be before or subsequent to processing by the modulator. The waveform 1006 is received by a driver component, for example, which can be a source of distortion or nonlinearity generated by the nonlinear component 102. As can be seen in the modulator waveform 1006, a small gap 1010 exists, in which two digital pulses are close in proximity to one another relative to a separation between other digital pulses. This small gap 1010 can be detected by the overlap component 906 in order to identify a potential section of two digital pulses that could be pulse swallowed, unaccounted for or over accounted for. Therefore, without accounting for the small gap 1010, the first digital pulse would be treated as a different size than it actually comprises, or one pulse could be negated or missed, which can cause further errors or distortions in the output waveform 1008 because the separated time differences could be too small to be accounted for. The result is a single (driver) pulse 1014 that differs from the desired two pulses separated by a gap as provided by the input waveform 1004. In addition, an overlap can be detected as portions of digital pulses 1012 of the waveform 1006 after pre-distortion, which overlap to make a smaller digital pulse than would otherwise be present. This result in a driver output waveform 1008 that is different than would otherwise be desired.

Figure 11:
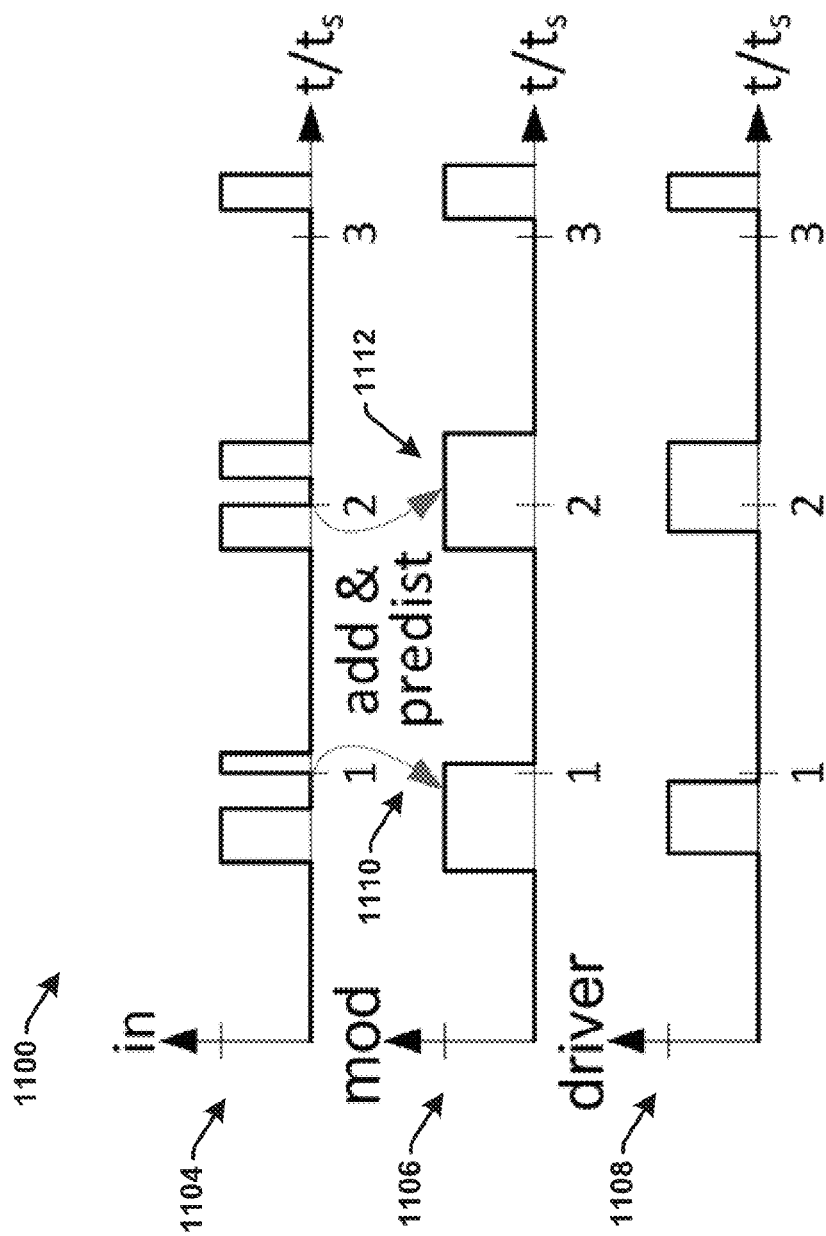
FIG. 11 illustrates another example of waveforms of a nonlinear system according to various aspects described.

Referring to FIG. 11, illustrated is an example of waveforms 1100 that are corrected according to various aspects. The overlap component 906 can operate to detect the overlap areas or regions of digital pulses so that these overlaps are accounts for during the selection processes of the selection component 512, generated into IQ data by the second edge timing component 514 and then added to reallocate the errors to compensated for the overlap at the adder component 516.

For example, the input waveform or data sample 1100 is received by the pre-distortion component 510 or the distortion compensation component 104. After a pre-distortion process, for example, the modulator or nonlinear component 102 then receives the waveform (mod) 1106, in which the separate portions of the first two digital pulses that are close together are added together so that the contributions of each become accounted for in the digital pulse 1110 during further processing to the output waveform 1108. Likewise, the digital pulses that are close together and occur at the transition from the second and third period are also added and pre-distorted to form the digital pulse 1112 to the modulator or after processing by the modulator, for example. The driver is then able to generate a desired waveform output 1108 based on a pre-distortion and correction of each digital pulse while taking into account adjacent digital pulses or adjacent periods in the correction/compensation processes.

Figure 12:
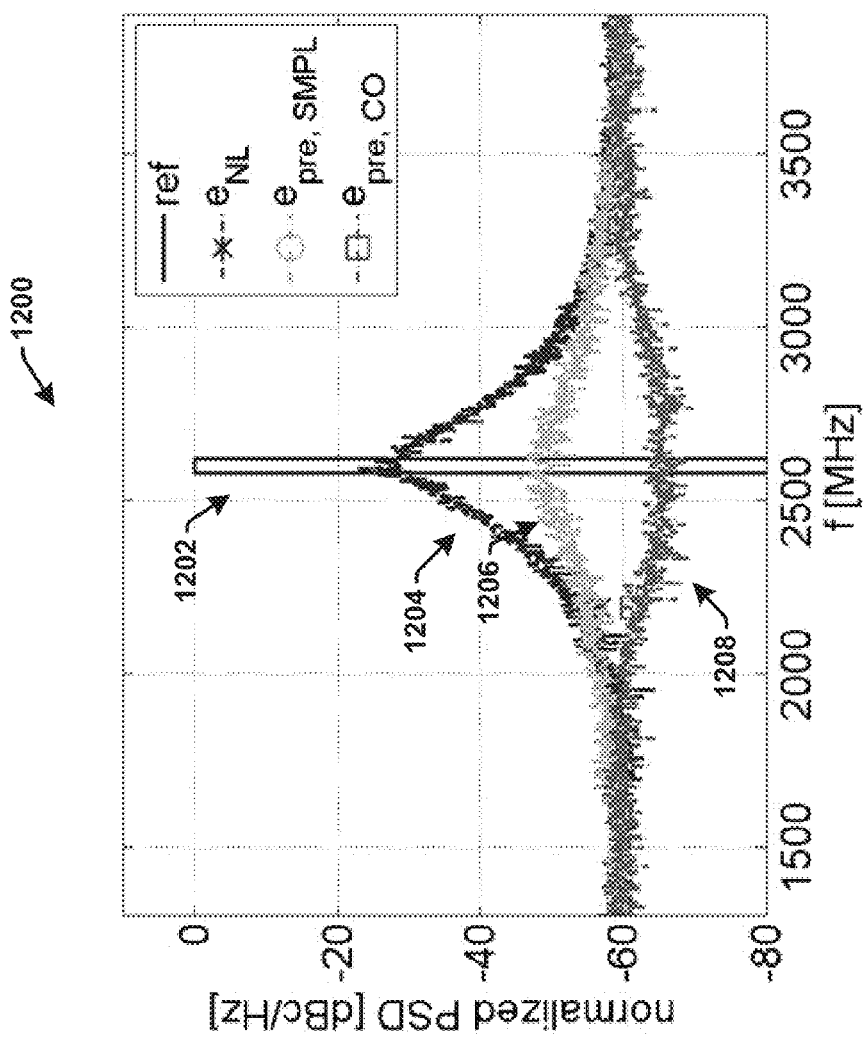
FIG. 12 illustrates an example of a signal spectra for a nonlinear system according to various aspects described.

Referring now to FIG. 12, illustrated is an example signal spectra in accordance with various aspects disclosed. The example spectra 1200 is illustrated as corresponding to an example RF PWM modulator with a 10 bit resolution at 2.6 GHz carrier signal with 40 MHz bandwidth illustrating an ideal reference signal 1202, the impact of the driver nonlinearity 1204, a sample based pre-distortion 1206 alone without any further compensation or pre-distortion based on each sample or set of digital pulses, and pre-distortion 1208 based on a per pulse basis taking into account carryovers with adjacent digital pulses at each pulse. An inband region of the spectrum signals can be within about 2000-2250 MHz to about 2750-3000 MHz, while an out of band region can outside of the inband ranges, for example. In cases where the RF PWM modulation core does not have sufficient resolution, noise shaping (e.g., Delta Sigma modulation) can be applied in order to increase the inband spectral quality. The pre-distortion by the distortion compensation component 104 can be combined with noise shaping circuitry in order to correct the driver nonlinearity, for example, and shape the quantization errors. Therefore, the carryover based distortion operations disclosed herein can better compensate for the nonlinearity effects of the digital RF PWM modulators, for example.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 13:
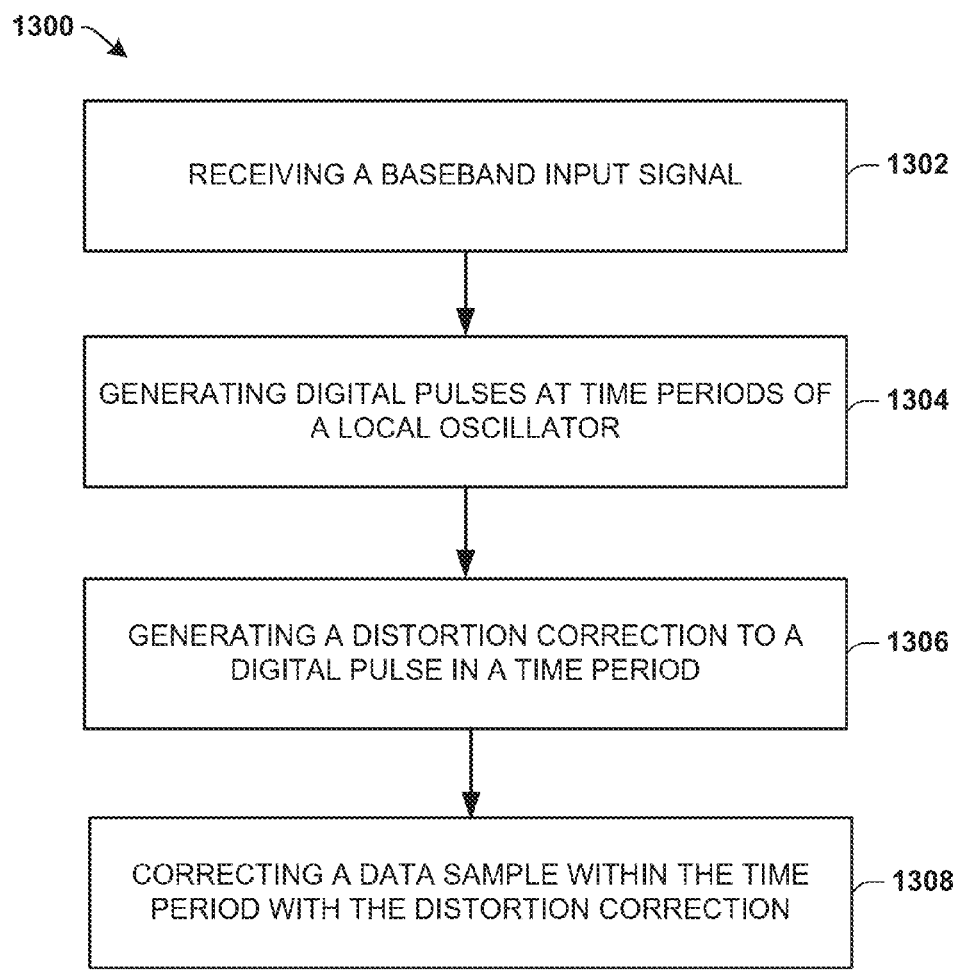
FIG. 13 illustrates an example of a flow diagram of a method for mitigating nonlinear distortion according to various aspects described.

Referring to FIG. 13, illustrated is a method 1300 for mitigating or removing nonlinearity in a nonlinear system or component of the system in accordance with various aspects described. The method 1300 initiates, and at 1302 comprises receiving a baseband input signal at a modulator (e.g., modulator component 502 or driver 204).

At 1304, a plurality of digital pulses is generated at a plurality of time periods of a local oscillator based on the baseband input signal.

At 1306, a distortion correction (e.g., a first distortion correction/distortion compensation) is generated to a first (current) digital pulse of the plurality of digital pulses in a first (current) time period of the plurality of time periods.

At 1308, a set of (first) sample data is corrected within the time period with the distortion correction, which corrects for a nonlinearity generated at an output of the modulator.

The method 1300 can further comprise generating a second distortion correction to a second digital pulse of the plurality of digital pulses in a second time period of the plurality of time periods so that at each (first, second, etc., digital pulses) is corrected. A second set of sample data can be corrected within the first time period of the plurality of time periods to correct the nonlinearity generated at the output of the modulator. Additionally, a carryover can be detected from a second digital pulse that is adjacent and prior to the first digital pulse or that is adjacent and subsequent to the first digital pulse. As such, generating the first distortion correction is based on the detected carryover (e.g., carryforward or carryback portions of digital pulses). One or more portions of at least one of a previous digital pulse to the first digital pulse, the first digital pulse or a subsequent digital pulse to the first digital pulse can then be selected, and reallocated within the plurality of digital pulses.

Figure 14:
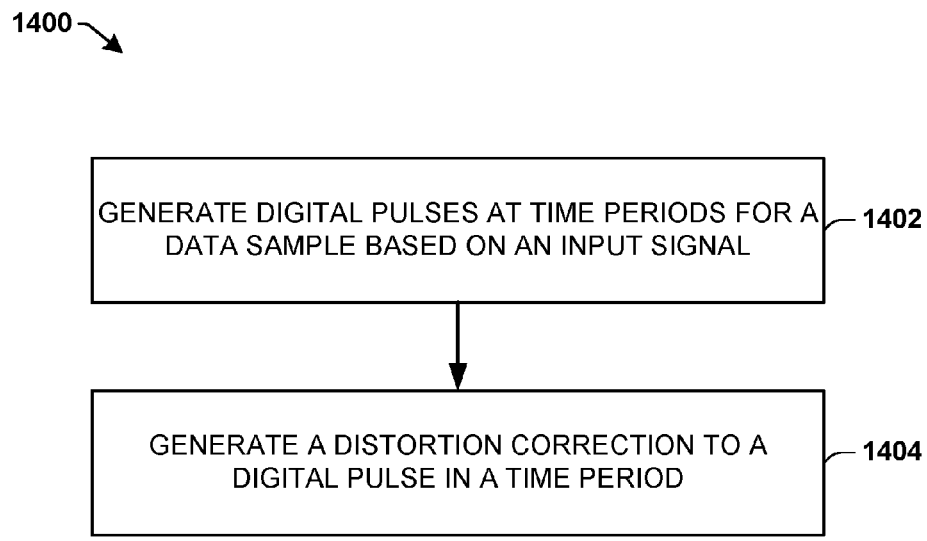
FIG. 14 illustrates another example of a flow diagram of a method for mitigating nonlinear distortion according to various aspects described

Referring to FIG. 14, illustrated is another example method 1400 in accordance with various aspects disclosed herein. At 1402, the method 1400 initiates, and comprises a device comprising a memory having executable instructions and a processor configured to execute the executable instructions to perform operation to generate a plurality of digital pulses at a plurality of time periods for a data sample based on an input signal.

At 1404, the processor operates to generate a nonlinear correction within a current time period of the plurality of time periods that mitigates the nonlinearity of the nonlinear component based on a contribution amount of the plurality of digital pulses to the nonlinearity within the current time period.

Applications (e.g., program modules) can include routines, programs, components, data structures, etc., that perform particular tasks or implement particular abstract data types. Moreover, those skilled in the art will appreciate that the operations disclosed can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of computer-readable media. Computer readable media can be any available media that can be accessed by the computer and includes both volatile and non-volatile media, removable and non-removable media. By way of example and not limitation, computer-readable media can comprise computer storage media and communication media. Computer storage media includes both volatile and non-volatile, removable and non-removable media implemented in any method or technology for storage of information such as computer-readable instructions, data structures, program modules or other data. Computer storage media (e.g., one or more data stores) can include, but is not limited to, RAM, ROM, EEPROM, flash memory or other memory technology, CD ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), CDMA2000, etc. UTRA includes Wideband-CDMA (W-CDMA) and other variants of CDMA. Further, CDMA2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical discs (e.g., compact disc (CD), digital versatile disc (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A communication system comprising:
   a memory storing executable components; and
   a processor, coupled to the memory, configured to execute the executable components, comprising:
   a modulator component configured to receive a modulator input signal and generate a plurality of digital pulses at a plurality of time periods of a local oscillator, and a modulated output signal that comprises a nonlinearity; and
   a distortion compensation component configured to generate a distortion compensation that corresponds to a first digital pulse of the plurality of digital pulses in a first time period of the plurality of time periods and corrects sample data within the first time period of the plurality of time periods to compensate the nonlinearity of the modulated output signal, correct the sample data within the first time period to compensate the nonlinearity by generating a correction of a sample carryover comprising an adjacent portion of an adjacent digital pulse that carries over into the first time period from a second digital pulse or a portion of the first digital pulse that carries over into a second time period, and reallocate the adjacent portion of the adjacent digital pulse or the portion of the first digital pulse to a different digital pulse of the plurality of digital pulses.

2. The communication system of claim 1, wherein the distortion compensation component is further configured to generate the distortion compensation based on a carryover region of the first digital pulse or the second digital pulse that overlaps the first time period and the second time period of the plurality of time periods.

3. The communication system of claim 1, wherein the distortion compensation component is further configured to generate and apply the distortion compensation to individual digital pulses of the plurality of digital pulses to compensate the nonlinearity.

4. The communication system of claim 1, further comprising:
   a carryforward component configured to detect a carryforward of the first digital pulse that overlaps into the second time period of the plurality of digital pulses; and
   a carryback component configured to detect a carryback of a subsequent digital pulse that overlaps into the first time period of the plurality of time periods;
   wherein the distortion compensation component is further configured to generate the distortion compensation based on at least one of the carryforward of the first digital pulse or the carryback of the subsequent digital pulse.

5. A communication system comprising:
   a memory storing executable components; and
   a processor, coupled to the memory, configured to execute the executable components, comprising:
   a modulator component configured to receive a modulator input signal and generate a plurality of digital pulses at a plurality of time periods of a local oscillator, and a modulated output signal that comprises a nonlinearity; and
   a distortion compensation component configured to generate a distortion compensation that corresponds to a first digital pulse of the plurality of digital pulses in a first time period of the plurality of time periods and corrects sample data within the first time period of the plurality of time periods to compensate the nonlinearity of the modulated output signal;
   a first edge timing component configured to convert an in-phase/quadrature phase (I/Q) baseband signal into the plurality of digital pulses; and
   a prediction component configured to predict a subsequent digital pulse to factor a carryback contribution of the subsequent digital pulse located within the first time period and the second time period.

6. The communication system of claim 5, wherein the distortion compensation component further comprises:

a pulse calculation component configured to generate a sample delay to the plurality of digital pulses based on the predicted subsequent digital pulse; and a pulse pre-distortion component, located downstream of the pulse calculation component, configured to generate a pre-distortion of the first digital pulse of the plurality of digital pulses based on a pulse timing of a previous digital pulse, the first digital pulse and the subsequent digital pulse.

7. The communication system of claim 6, wherein the distortion compensation component further comprises:
   a selection component configured to select one or more portions of the plurality of digital pulses within the first time period;
   a second edge timing component configured to convert the plurality of digital pulses back into I/Q data; and
   an adder configured to selectively redistribute the one or more portions of the plurality of digital pulses into the I/Q data.

8. The communication system of claim 1, further comprising:
   an overlap component configured to detect an overlap in at least two digital pulses of the plurality of digital pulses, the overlap comprising an overlapping region or a close proximity among the at least two digital pulses relative to other digital pulses of the plurality of digital pulses, and add contributions of the at least two digital pulses to form a unified single pulse.

9. A device that mitigates nonlinearity from a nonlinear behavior of a nonlinear component comprising:
   a memory storing executable instructions; and
   a processor, coupled to the memory, configured to execute or facilitate execution of the executable instructions to at least:
      generate a plurality of digital pulses at a plurality of time periods for a data sample based on an input signal;
      generate a nonlinear correction within a current time period of the plurality of time periods that mitigates the nonlinearity of the nonlinear component based on a contribution amount of the plurality of digital pulses to the nonlinearity within the current time period; and
      reallocate a region of an adjacent digital pulse overlapping the current time period and a different time period, to another digital pulse to generate the nonlinear correction within the current time period.

10. The device of claim 9, wherein the processor further executes or facilitates the execution of the executable instructions to:
    generate the nonlinear correction to a current digital pulse in the current time period based on a pulse timing of at least one adjacent digital pulse that is adjacent in time before or after the first digital pulse.

11. The device of claim 9, wherein the processor further executes or facilitates the execution of the executable instructions to:
    generate a pre-distortion of the plurality of digital pulses to mitigate the nonlinearity; and
    correct a current digital pulse of the plurality of digital pulses by detecting a carryforward region or a carryback region of the plurality of digital pulses that carries over into the current time period and a different time period of the plurality of time periods.

12. The device of claim 11, wherein the processor further executes or facilitates the execution of the executable instructions to:
    ensure that less than three digital edges occur within the current time period of the plurality of time periods.

13. The device of claim 11, wherein the processor further executes or facilitates the execution of the executable instructions to:
    dispersing the contribution amount of the plurality of digital pulses from at least one digital pulse region within the current time period to another time period of the plurality of time periods.

14. The device of claim 9, wherein the contribution amount comprises a carryforward region or a carryback region of at least one digital pulse that overlaps with a previous time period that is previous to the current time period or a subsequent time period that is subsequent to the current time period.

15. The device of claim 9, wherein the processor further executes or facilitates the execution of the executable instructions to:
    apply the nonlinear correction differently to individual digital pulses of the plurality of digital pulses based on pulse timings of the individual digital pulses, previous digital pulses and subsequent digital pulses that respectively correspond in time to the individual digital pulses.

16. The device of claim 9, wherein the processor further executes or facilitates the execution of the executable instructions to:
    generate a pre-distortion of a current digital pulse of the plurality of digital pulses within the current time period based on a pulse timing of a previous digital pulse, the current digital pulse and a subsequent digital pulse.

17. The device of claim 16, wherein the processor further executes or facilitates the execution of the executable instructions to:
    select one or more regions of at least one of the previous digital pulse, the current digital pulse or the subsequent digital pulse; and
    reallocate the one or more regions within the plurality of digital pulses.

18. The device of claim 16, wherein the processor further executes or facilitates the execution of the executable instructions to:
    detect an overlap in at least two of the plurality of digital pulses that comprises overlapping regions with one another or a close proximity with one another relative to other digital pulses, and add contributions of the digital pulses to form a unified single pulse.

19. A method for correcting nonlinearity from a nonlinear component comprising:
    receiving a baseband input signal at a modulator;
    generating, via the modulator, a plurality of digital pulses at a plurality of time periods of a local oscillator based on the baseband input signal, and a modulated output signal that comprises a nonlinearity;
    generating a first distortion correction to a first digital pulse of the plurality of digital pulses in a first time period of the plurality of time periods; and
    correcting a first set of sample data within the first time period of the plurality of time periods with the first distortion correction that corrects the nonlinearity of the modulated output signal generated at an output of the modulator; and
    correcting the first set of sample data within the first time period to compensate the nonlinearity by generating a correction of a sample carryover comprising an adjacent portion of an adjacent digital pulse that carries over into the first time period from a second digital pulse or a portion of the first digital pulse that carries over into a second time period, and reallocating the adjacent portion of the adjacent digital pulse or the portion of the first digital pulse to a different digital pulse of the plurality of digital pulses.

20. The method of claim 19, further comprising:

generating a second distortion correction to the second digital pulse of the plurality of digital pulses in the second time period of the plurality of time periods;

correcting a second set of sample data within the first time period of the plurality of time periods to correct the nonlinearity generated at the output of the modulator.

21. The method of claim 19, further comprising:

detecting the sample carryover from the second digital pulse that is adjacent and prior to the first digital pulse or that is adjacent and subsequent to the first digital pulse;

wherein the generating the first distortion correction is based on the carryover.

22. The method of claim 19, further comprising:

selecting one or more portions of at least one of a previous digital pulse to the first digital pulse, the first digital pulse or a subsequent digital pulse to the first digital pulse; and reallocating the selected one or more portions within the plurality of digital pulses.

\* \* \* \* \*